PROCESS OF MAKING MULTI-LAYER DEVICES

Filed Aug. 29, 1960 2 Sheets-Sheet 1

INVENTOR
DONALD S. WEED
BY J T Comfort
ATTORNEY

PROCESS OF MAKING MULTI-LAYER DEVICES

Filed Aug. 29, 1960 2 Sheets-Sheet 2

United States Patent Office 3,100,723
Patented Aug. 13, 1963

3,100,723

PROCESS OF MAKING MULTI-LAYER DEVICES

Donald S. Weed, Hurley, N.Y., assignor to International Business Machines Corporation, New York, N.Y., a corporation of New York Filed Aug. 29, 1960, Ser. No. 52,452
3 Claims. (Cl. 117—217)

This invention relates to the manufacture of thin films, such as thin films to be employed in superconductive devices and circuits and multi-layer electrical devices and circuits.

The phenomenon of super conductivity, treated at length in such texts as the "Cambridge Monograph on Physics (Superconductivity)," by D. Shoenberg, second edition, 1951, relates to the unimpeded flow of current through a conductor maintained at temperatures near absolute zero. A thin film of material, such as tin or lead, when maintained at below its critical temperature will offer no resistance to current flow therethrough. However, should the temperature rise above its critical temperature, the thin film offers resistance to the flow of current. A magnetic field applied to the length of a long superconducting wire, or strip of thin film, causes the resistance of the super conducting wire or strip of thin film to be restored at a definite field strength, called the "critical field." The critical field depends on the temperature, thickness, and purity of the wire or strip and is characteristic of the particular metal concerned. The abruptness with which resistance is restored will also depend upon the purity of the superconducting wire or strip. A paper that treats of this abrupt or sharp transition from the resistive state to the superconductive state, and vice versa, appears in the Royal Society of London, "Philosophical Transactions," Series A, 1955–56, pp. 553–573, entitled, "The Transition to Superconductivity," by P. R. Doidge.

The principles of superconductivity have been applied to the computer field because the two states of a superconductor, namely, its resistive state and its superconducting state, can be representative of two separate and distinct conditions that lend themselves to applications employing binary logic. However, whenever a bistable device is employed, it is desirable that the switching of the bistable device from one state to its other state be as rapid as possible.

In the manufacture of bistable superconductive elements, thin films of metal, of the order of $10^{-5}$ to $10^{-6}$ cm. thick, are prepared by vapor deposition under a vacuum onto a substrate of mica, glass or plastic, or any suitable supporting base. These thin films separated by thin insulative films may be deposited in various lengths and widths. When a critical magnetic field is applied to such a thin superconductive film, the film will switch from its superconductive state to its resistive state. The closer the temperature of the latter is to absolute zero the stronger the magnetic field must be to drive the thin film resistive. Upon removal of such magnetic fields, the superconductor will return to its superconductive state.

The instant disclosure treats only so much of the theory of superconductors that will enable a skilled person in the art to duplicate the invention hereinafter described.

The development and use of deposited non-cryogenic multi-layer thin film electrical devices provide electronic circuitry with components that have a high density packing factor, low weight, and improved reliability. The passive circuit elements (such as resistors, capacitors and conductors) are deposited on a substrate in a high vacuum or other controlled environment and non-deposited active elements (transistors and diodes) are secured to the substrates with their leads bonded to the lands of the deposited circuitry. By interleaving insulating layers, capacitors and multi-layers of other passive elements may be formed on a single substrate. Separate thin film components on the same substrate are connected by overlapping a portion of the films, largely eliminating the need for terminals, conductors and the packaging of individual components.

Heretofore, a major problem in the manufacture of multi-layer thin film electrical devices and superconductive devices has been caused by the numerous short circuits between the conductive thin film layers, the short circuits caused by pin holes in the insulative or dielectric films separating the conductive layers.

Numerous attempts have been made to eliminate the short circuits. Such attempts have included thorough pre-cleaning of the substrate, a better vacuum during evaporation, deposition onto heated substrates and clearing the shorts after deposition by applying a voltage between conductors separated by an insulative layer. Such prior attempts, though helpful, have not always been successful. The clearing of shorts after fabrication destroys superimposed layers and cleared shorts often reappear.

It is therefore an object of this invention to provide a novel process of making an improved thin film electrical device.

A further object of this invention is to provide a novel process of making an improved multi-layer thin film electrical device.

Another object of this invention is to provide a novel process of making an improved superconductive device.

It is yet another object of this invention to provide a novel process of making a short-free multi-layer thin film device.

Still another object of this invention is to provide a novel process of making a short-free superconductive device.

The present invention overcomes the deficiencies in the prior art and provides short free multi-layer thin film electrical devices and superconductors. In accordance with the teachings of this invention a first electrical conductive thin film is first deposited onto a substrate. Next an insulating thin film is deposited over the first conductive thin film and then a second electrical conductive thin film is deposited over the insulative film. During the deposition of the second electrical conductive thin film a potential is applied between the first and second electrically conductive thin films. The application of the potential between the electrically conductive thin films separated by the insulative thin film during the deposition of the second thin film causes a device to be produced which is short free. The word substrate used here and in the claims nears any surface onto which a film may be deposited including a previously deposited film. Multi-layer thin film devices and superconductive devices formed with the teachings of this invention consistently produce short free devices.

Figure 1:
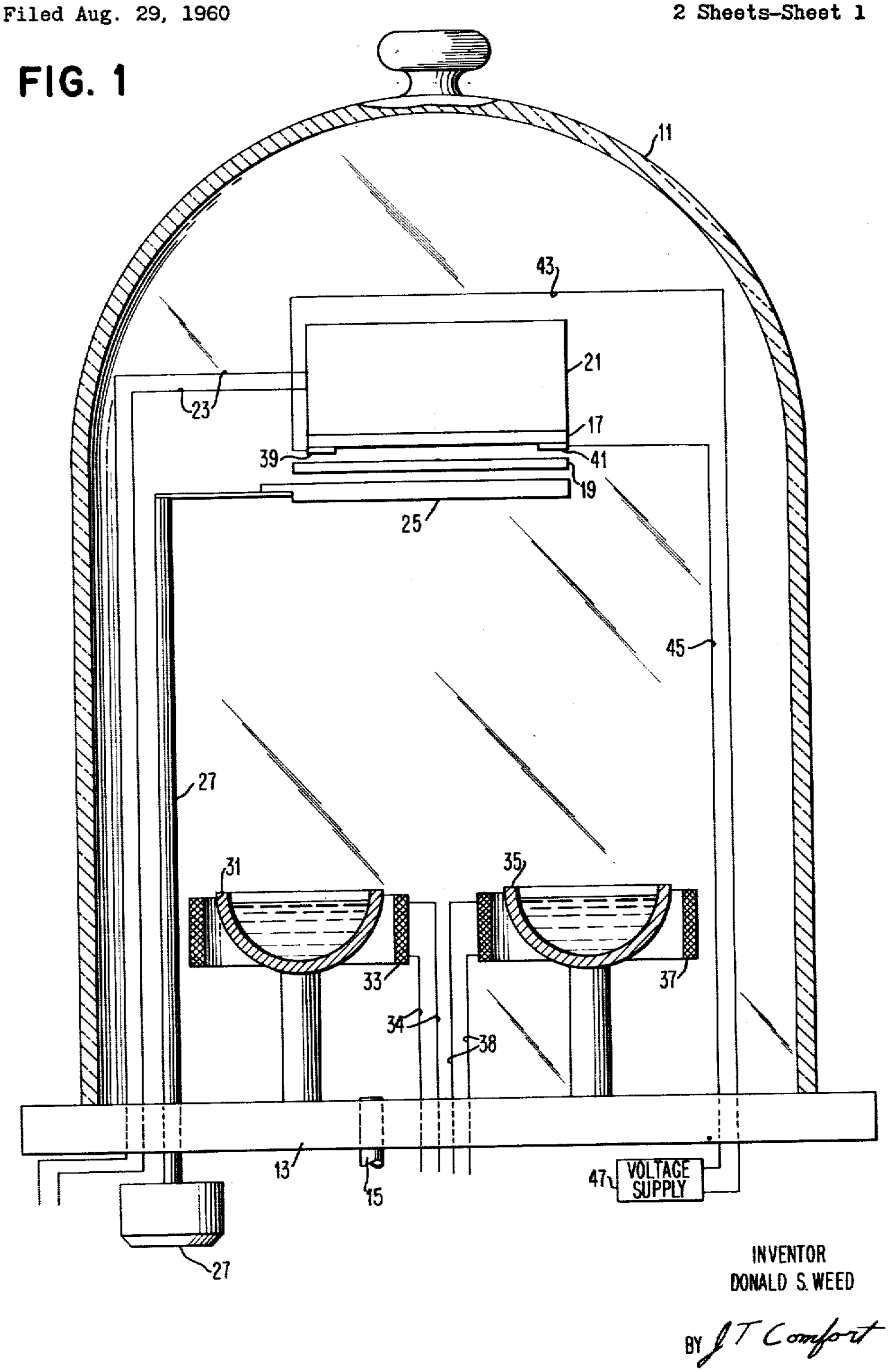
FIG. 1 is a schematic representation of apparatus used in carrying out the invention.

Referring to FIG. 1 for a description of apparatus for carrying out this invention, bell jar 11 is placed on and makes an air tight seal with base plate 13. A vacuum is obtained in the chamber formed by the combination of bell jar 11 and base plate 13 by the operation of a pump (not shown) having its exhaust part connected through orifice 15 in base 13. The chamber is exhausted by operating the pump until a low pressure exists within the chamber. Substrate 17 and mask 19 in an evaporation position are supported by well known means, not shown.

to the specific conditions or details set forth in these examples, except insofar as such limitations are specified in the appended claims.

Figure 2:
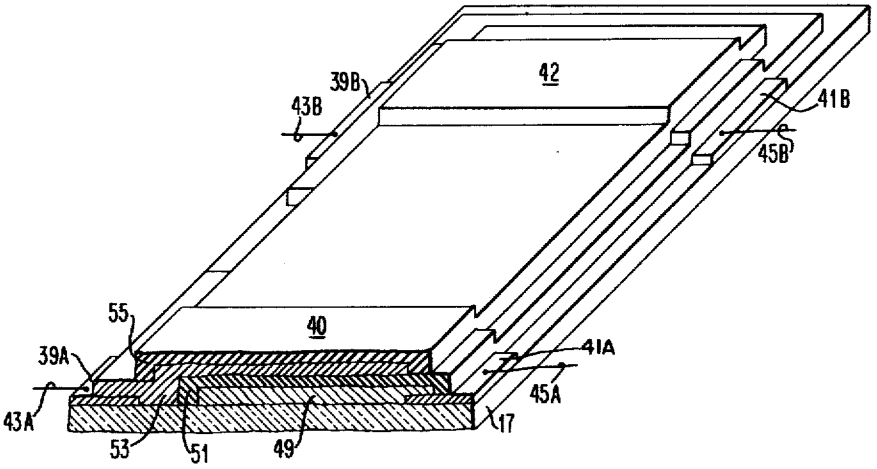
FIG. 2 is an oblique view of two capacitors with a section taken through one capacitor.

Employing the apparatus described with relation to FIG. 1, a series of capacitors were deposited on a fine glass microscopic slide functioning as a substrate in accordance with the teachings of this invention. Referring to FIG. 2 these capacitors were fabricated by using a standard substrate 17 with lands 39 and 41 affixed to the substrate.

Two capacitors were fabricated on each substrate and three substrates were fabricated for a total of six capacitors. FIGURE 2 shows a substrate 17 with two capacitors 40 and 42 fabricated. A section is taken through capacitor 40 to show the multi-layers of dielectric, insulative and conductive layers. Capacitors 40 and 42 are illustrative of the six capacitors fabricated. The six capacitors fabricated are tabulated in Table I. The references to specific lands, leads and thin film layers in the description of the following examples of the fabrication of capacitors 1–6 in Table I are applicable to capacitors 40 and 42 in FIG. 2.

*Table I*

| Substrate | Pressure | Capacitor | Condition of dielectric before deposition of 2nd conductive layer | Voltage applied during deposition of 2nd layer | Condition of capacitor after fabrication |
|---|---|---|---|---|---|
| A | $5 \times 10^{-6}$ mm. Hg | 1 | Appears to be good | 5 | Good. |
| | | 2 | do | None | Shorted out. |
| B | $5 \times 10^{-6}$ mm. Hg | 3 | Hole placed in dielectric | 5 | Good. |
| | | 4 | do | None | Shorted out. |
| C | $5 \times 10^{-6}$ mm. Hg | 5 | Appears to be good | None | Good. |
| | | 6 | Hole placed in dielectric | 2 | Do. |

Because of the many different combinations of patterns which may be necessary to produce the complex cryogenic circuits and multi-layer thin film electrical circuits, it may be desirable to fabricate more than one substrate during a single evacuation of the vacuum chamber and to deposit a number of coatings of thin films of different configurations on the same substrate. Substrate processing apparatus showing apparatus capable of applying one or more vacuum evaporated coatings to a plurality of substrates is described in Patent No. 3,023,727, to Theodoseau et al., filed September 10,1959, assigned to the same assignee as the present invention.

A heater 21 supplied with electrical energy by wires 23 may heat the substrate 17. A shutter 25 mounted on rotatable shaft 27 is controlled by knob 29. By operation of the shutter, selective areas of the mask may be exposed to control the area of deposition on the substrate. A first crucible 31 heated by coil 33 contains the electrically conductive component which is to be deposited on substrate 17. A second crucible 35 heated by coil 37 contains the insulative component which is to be deposited on substrate 17. Means (not shown) are employed for supplying controlled and variable amounts of electrical energy to coils 33, 37 by wires 34 and 38 respectively. The energy supplied coils 33 and 37 is monitored separately to control the amount of each component evaporated and therefore the thickness of the film deposited. Means for precisely controlling the thickness of the film formed on the substrate is shown in more detail form in co-pending patent application, Serial Number 40,707, to Fury et al., filed July 5, 1960, now U.S. Patent No. 3,059,611, assigned to the same assignee as the present invention. Lands 39 and 41 are affixed to the substrate with wires 43 and 45, respectively, affixed to lands 39 and 41. Wires 43 and 45 are connected to a voltage supply 47. The evaporants condense on the substrate at points thereon defined by the mask and shutter.

In order to disclose the nature of the present invention clearly, the following illustrative examples will be given. It is to be understood that the invention is not to be limited Capacitors 1 and 2 on substrate A (in Table I) were fabricated first. Wires 43A and 45A were secured to lands 39A and 41A of capacitor 1, respectively, by thermo-compression bonding. The substrate was then placed in the vacuum chamber. Lead was placed in crucible 31 and silicon monoxide in crucible 35. Bell jar 11 was then placed on base plate 13 and the vacuum shown in Table I was obtained. Mask 14 and shutter 25 were then placed in position. The proper mask configuration was determined by selectively moving shutter 25 to expose the points on substrate 17 on which a lead conductor evaporant was to be deposited. Energy was applied to coil 33 heating crucible 31 causing the lead in crucible 31 to evaporate. The lead thereupon condensed on substrate 17 in a layer (layer 49 in FIG. 2) in a pattern defined by the mask and shutter making electrical contact with circuit lands (lands 41A and 41B of capacitor 4 in FIG. 2). The proper configuration was next determined for the dielectric layer by selectively moving shutter 25 (in FIG. 1) to expose the points on substrate 17 on which the silicon monoxide dielectric evaporant was to be deposited. Energy was applied to coil 37 to heat crucible 35 causing the silicon monoxide in crucible 35 to evaporate and condense on substrate 17 and form a dielectric layer (layer 51 of capacitor 40 in FIG. 2) over the lead conductive layer (layer 49 of capacitor 40).

The proper mask configuration was next determined for the second lead conductive layer by selectively moving shutter 25 to expose the points on substrate 17 on which the lead conductive layer was to be deposited. A constant potential of 5 volts was then applied between the lands (lands 39A and 41A of capacitor 40) by connecting the affixed wires to the lands (wires 43A and 45A in FIG. 2) to a constant voltage source 47 (in FIG. 1). No current flowed as the second conductor had not been deposited. No potential was applied between the lands of capacitor 2 on substrate A.

Energy was then applied to coil 33 to heat crucible 31 causing the lead in crucible 31 to evaporate and condense on substrate 17 in a second lead conductive layer (layer 53 of capacitor 40 in FIG. 2). Current flowed between the lands (lands 39A and 41A of capacitor 40) during the deposition of the second conductive layer.

After the deposition of the second lead conductive layer the application of a potential between the lands was stopped. An insulative layer (layer 55 of capacitor 40) of silicon monoxide was next deposited on substrate 17 to cover and protect the capacitors.

Capacitors 1 and 2 on substrate A were removed from the vacuum chamber and tested. Capacitor 1 which had a 5-volt potential applied between its leads during deposition of its second conductive layer had no shorts. Capacitor 2, however, showed a dead short and was useless.

To further determine the effectiveness of this invention, further fabrications of capacitors were made. Capacitors 3 and 4 on substrate B were fabricated. The first lead conductor layer and the silicon monoxide layer were deposited in the same manner as the corresponding layers of capacitors 1 and 2 were deposited with the pressure maintained as tabulated in Table I. Substrate B was then removed and holes were put in the dielectric layers of both capacitors 3 and 4. The substrate was then replaced and the two remaining lead layers deposited. A 5 volt potential was maintained between the lands of capacitor 3 during the deposition of the second conductive layer as was done in the fabrication of capacitor 1. No voltage was applied between the leads of capacitor 4. Substrate B was removed and capacitors 3 and 4 tested. Capacitor 3 was short-free and capacitor 4 was shorted out.

Capacitors 5 and 6 on substrate C were fabricated in the same manner as capacitors 1–4 with a hole put in the dielectric of capacitor 6 and a potential of 2 volts applied between the lands of capacitor 6. The 2 volt potential was not applied constantly but frequently during the deposition of the second lead conductive layer. After fabrication capacitors 5 and 6 were tested. Both capacitors were good and had no shorts. Some good capacitors may be fabricated without using the teachings of this invention as shown by the good capacitor 5, but the yield is much better with the application of the teaching of this invention. Holes were placed in the dielectric of two capacitors on one substrate many other times and voltage was applied between the two conductive layers of one capacitor and no voltage between the other one. Invariably the voltage applied produced a good capacitor and the non-voltage produced a bad capacitor.

Figure 4:
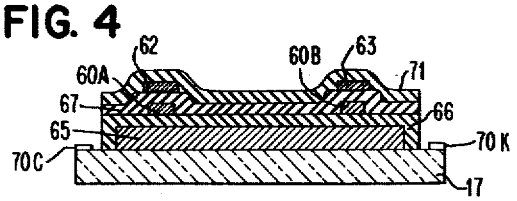
FIG. 4 is a section taken on line A—A through the in-line flip-flop shown in FIG. 3.
Figure 3:
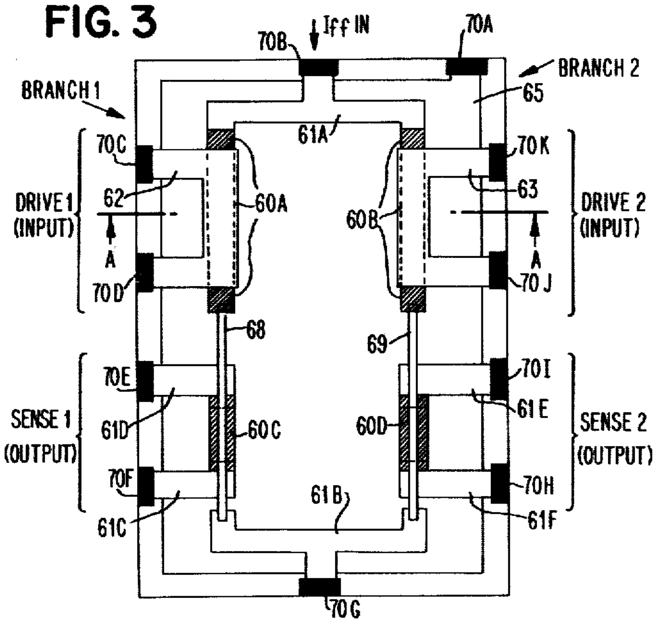
FIG. 3 is a schematic diagram of a cryogenic in-line flip-flop.

The method of this invention was applied to the fabrication of cryogenic in-line flip-flops. FIG. 3 shows a cryogenic in-line flip-flop and FIG. 4 is a cross-section taken along line A—A. The silicon monoxide insulating layers are shown in FIG. 4 but not in FIG. 3. The different layers were deposited in the same manner described for the capacitors with the apparatus shown in FIG. 1. The pressure was maintained at $5\times10^{-6}$ mm. Hg. Referring now to FIGS. 3 and 4, a ground plane 65 of lead was first deposited on substrate 17 with the ground plane electrically connected to lands 70A–70K. Next a layer of silicon monoxide insulation 66 (shown in FIG. 4 only) was deposited over the ground plane. Tin gates 60A–60D were next deposited. Conductors of leads 61A–61F were then deposited making electrical contact at the specified points. A layer of silicon monoxide insulation 67 (shown in FIG. 4 only) was then deposited. Drive control conductors 62 and 63 and conductors 68 and 69 were then deposited. A final layer of silicon monoxide insulation 71 (shown in FIG. 4 only) was deposited to protect the flip-flop. The films are each approximately 8000 A. thick.

The operation of the in-line flip-flop is described briefly. A direct current $I_{ff}$ is applied to the flip-flop loop at land 70B. Drive control 62 of branch 1 is energized to generate $H_c$ (the film critical field) for tin gate 60A, causing the tin gate 62 to go from superconducting to normal resistive, causing all of the $I_{ff}$ to switch to branch 2. The current in branch 2 is now sufficient to restore resistance in tin gate 60 so the state of the flip-flop may be sensed. To switch the current back to branch 1, drive control 62 is energized.

Many of the cryotron in-line flip-flops constructed with the teachings of the prior art show shorts in the insulation after fabrication. Four in-line flip-flops were fabricated as an example. In the fabrication of two, a constant voltage of 3 volts was applied between the leads of two of the electrically conductive layers separated by an insulation layer during evaporation of the second conductive layer. Both in-line flip-flops fabricated using the method of this invention were short-free. Of the two fabricated without the application of a constant voltage, both were shorted out.

Other multi-layer electrical devices were fabricated using the teachings of this invention. Short free devices were consistently produced.

This process is particularly well adapted for preventing shorts in fabricating an electrical device having multi-layer thin films. In such instances, a potential is first applied between the first and second conductive layers separated by an insulative layer during the deposition of the second conductive layer. A potential is next applied between the second and third conductive layers separated by an insulative layer during the deposition of the third conductive layer. The process is continued during the deposition of succeeding conductive and insulative layers until the fabrication is completed.

The materials used for the dielectric and conductive thin films are illustrative and other well known dielectric, insulative and conductive thin films may be used.

It is not clearly understood why the application of a voltage between two conductive layers separated by an insulative layer during the deposition of the second conductive layer prevents shorts and modifies the effect of pin holes in the insulation. Shorts are caused by a metallic connection between the two conductive layers. The metallic connection is due to deposition of the metallic component in the pin holes in the insulative layers. It may be theorized that during the deposition of the second conductive layer, a current flows as soon as the second conductive layer is continuous, causing any metallic connection between the two plates to be broken. This break is maintained throughout the evaporation of the second conductor. A hole through the second conductive layer and the insulation to the first conductive layer appears to be left after deposition of the second conductive layer, but no metal of the second conductive layer is left in the hole to make electrical contact with the first conductive layer. The subsequent deposition of a layer of silicon monoxide insulation appears to cover the hole preventing any subsequent joining of the two conductors. The multilayer devices thus fabricated do not later develop shorts.

The potential applied during the deposition of the second conductive layer may be varied depending on the thickness of the films deposited and the material deposited. The voltages used in the examples are illustrative of workable voltages.

While particular embodiments of the invention have been described, it will be understood, of course, that the invention is not limited thereto since many modifications may be made, and it is, therefore, contemplated to cover by the appended claims any such modifications as fall within the true spirit and scope of the invetnion.

What is claimed is:

1. A process of producing thin film electrical device which comprises the steps of depositing a first electrically conductive thin film onto a substrate, depositing an insulative thin film over said first thin film, depositing a second electrically conductive thin film over said insulative film, and applying a potential between said first and said second electrically conductive thin films during the deposition of said second electrically conductive thin film.

2. A process of producing thin film electrical device which comprises the steps of depositing a first electrically conductive thin film onto a substrate, depositing an insulative thin film over said first thin film, depositing a second electrically conductive thin film over said insulative thin film, and applying a constant potential between said first and said second electrically conductive thin films during the deposition of said second electrically conductive thin film.

3. A process of producing a capacitor comprising the steps of depositing a first electrically conductive thin film, depositing an insulative film over said first thin film, depositing a second electrically conductive thin film over said insulative film, and applying a potential between said first and said second electrically conductive thin films during the deposition of said second electrically conductive thin film.

References Cited in the file of this patent

UNITED STATES PATENTS

| | | |
|---|---|---|
| 2,088,949 | Fekete | Aug. 3, 1937 |
| 2,525,668 | Gray | Oct. 10, 1950 |
| 2,879,183 | Doherty et al. | Mar. 24, 1959 |
| 2,932,591 | Goodman | Apr. 12, 1960 |
| 2,958,117 | Robinson et al. | Nov. 1, 1960 |

UNITED STATES PATENT OFFICE
CERTIFICATE OF CORRECTION

Patent No. 3,100,723 August 13, 1963

Donald S. Weed

It is hereby certified that error appears in the above numbered patent requiring correction and that the said Letters Patent should read as corrected below.

Column 2, line 63, for "nears" read -- means --; column 5, line 64, for "leads" read -- lead --; column 6, lines 37 and 38, for "conducitve" read -- conductive --; line 67, for "invetnion" read -- invention --.

Signed and sealed this 26th day of May 1964.

(SEAL)
Attest:

ERNEST W. SWIDER
Attesting Officer

EDWARD J. BRENNER
Commissioner of Patents